United States Patent
Uehara et al.

(10) Patent No.: US 6,767,840 B1
(45) Date of Patent: Jul. 27, 2004

(54) WAFER PROCESSING APPARATUS, WAFER PROCESSING METHOD, AND SEMICONDUCTOR SUBSTRATE FABRICATION METHOD

(75) Inventors: Fumio Uehara, Hachioji (JP); Kiyofumi Sakaguchi, Yokohama (JP); Kazutaka Yanagita, Yokohama (JP); Masakazu Harada, Akiruno (JP)

(73) Assignee: Canon Kabushiki Kaisha, Tokyo (JP)

( * ) Notice: Subject to any disclaimer, the term of this patent is extended or adjusted under 35 U.S.C. 154(b) by 69 days.

(21) Appl. No.: 09/664,715

(22) Filed: Sep. 19, 2000

Related U.S. Application Data

(62) Division of application No. 09/025,409, filed on Feb. 18, 1998, now Pat. No. 6,199,563.

(30) Foreign Application Priority Data

Feb. 21, 1997 (JP) ............................................. 9-038079
Feb. 21, 1997 (JP) ............................................. 9-038080

(51) Int. Cl.[7] ............................................ H01L 2/1302
(52) U.S. Cl. ....................... 438/745; 438/747; 438/753; 216/38; 156/345
(58) Field of Search ................................ 438/691, 692, 438/745, 747, 753, 756; 216/38, 39, 56, 89, 90, 99; 156/345

(56) References Cited

U.S. PATENT DOCUMENTS

| | | |
|---|---|---|
| 2,702,260 A | 2/1955 | Massa |
| 3,964,957 A | 6/1976 | Walsh .......................... 156/345 |
| 4,191,295 A | 3/1980 | Tams, III ...................... 211/41 |
| 4,325,394 A | 4/1982 | Reams ......................... 134/141 |

(List continued on next page.)

FOREIGN PATENT DOCUMENTS

| | | |
|---|---|---|
| EP | 319806 | 6/1989 |
| EP | 554795 | 8/1993 |
| EP | 694957 | 1/1996 |
| EP | 740331 | 10/1996 |
| FR | 2626261 | 7/1989 |
| JP | 53-144265 | 12/1978 |
| JP | 62-283632 | 9/1987 |
| JP | 0 319 806 | 6/1989 |
| JP | 1-187931 | 7/1989 |
| JP | 1-304733 | 8/1989 |
| JP | 1-304733 | 12/1989 |
| JP | 3-62925 | 3/1991 |
| JP | 3-257826 | 11/1991 |
| JP | 5-243203 | 9/1993 |
| JP | 07-142439 A | 6/1995 |
| JP | A 7-302889 | 11/1995 |

(List continued on next page.)

OTHER PUBLICATIONS

K. Sakaguchi, et al., Extremely High Selective Etching Of Porous Si For Single Etch–Stop Bond–And–Etch–Back Silicon–on–Insulator, *Jpn. J. Appl. Phys.*, vol. 34 (1995) pp. 842–847, Part 1, No. 2B, Feb. 1995.
Communication dated Aug. 6, 2001 in EP 98102897 and Partial European Search Report.
European Patent Office's Communication dated Oct. 15, 2001, in EP 98102897and a European Search Report.
Chinese Office Action dated Jan. 4, 2002 issued by the Patent Office of P. R. China and the English translation of the Office Action.

*Primary Examiner*—Kin-Chan Chen
(74) *Attorney, Agent, or Firm*—Morgan & Finnegan, LLP

(57) ABSTRACT

An ultrasonic bath (30) is arranged below a wafer processing bath (10). Wafers (40) are processed while ultrasonic waves are transmitted from the ultrasonic bath (30) to the wafer processing bath (10). The wafers (40) are processed while being entirely dipped into the wafer processing bath (10) and rotated by wafer rotating rods (53).

12 Claims, 10 Drawing Sheets

U.S. PATENT DOCUMENTS

| | | | | |
|---|---|---|---|---|
| 4,736,760 A | | 4/1988 | Coberly et al. | 134/134 |
| 4,804,007 A | | 2/1989 | Bran | 134/184 |
| 4,854,337 A | * | 8/1989 | Bunkenburg et al. | 134/184 |
| 4,874,484 A | * | 10/1989 | Foell et al. | 438/750 |
| 5,017,513 A | * | 5/1991 | Takeuchi | 438/688 |
| 5,277,769 A | * | 1/1994 | Medernach | 438/14 |
| 5,286,657 A | | 2/1994 | Bran | 437/9 |
| 5,327,921 A | | 7/1994 | Mokuo et al. | 134/182 |
| 5,593,505 A | | 1/1997 | Erk et al. | 134/1.3 |
| 5,593,537 A | | 1/1997 | Cote et al. | 156/636.1 |
| 5,672,212 A | * | 9/1997 | Manos | 134/1.3 |
| 5,727,582 A | | 3/1998 | Terui | 134/140 |
| 5,791,357 A | | 8/1998 | Hasegawa | 134/137 |
| 5,816,274 A | | 10/1998 | Bartram et al. | 134/140 |
| 5,854,123 A | * | 12/1998 | Sato et al. | 438/478 |
| 5,911,864 A | * | 6/1999 | Eldridge | 205/124 |
| 6,058,945 A | * | 5/2000 | Fujiyama et al. | 134/1.3 |
| 6,103,009 A | * | 8/2000 | Atoji | 117/91 |
| 6,127,281 A | * | 10/2000 | Sakaguchi et al. | 156/345 |
| 6,337,030 B1 | * | 1/2002 | Sakaguchi | 216/91 |

FOREIGN PATENT DOCUMENTS

| | | |
|---|---|---|
| JP | 8-117702 A | 5/1996 |
| JP | 8-293478 | 11/1996 |
| JP | 8-316182 | 11/1996 |
| JP | 9-038079 | 2/1997 |
| JP | 9-038080 | 2/1997 |

* cited by examiner

WAFER PROCESSING APPARATUS, WAFER PROCESSING METHOD, AND SEMICONDUCTOR SUBSTRATE FABRICATION METHOD

This is a divisional application of application Ser. No. 09/0254 filed Feb. 18, 1998, now U.S. Pat. No. 6,199,563B1.

BACKGROUND OF THE INVENTION

1. Field of the Invention

The present invention relates to a wafer processing apparatus, a wafer processing method, and a semiconductor substrate fabrication method and, more particularly, to a wafer processing apparatus for processing a wafer by dipping it into a processing solution, a wafer processing method, and a semiconductor substrate fabrication method.

2. Description of the Related Art

Cleaning processing is a typical example of wafer processing. One subject of wafer cleaning is to increase the speed. Japanese Patent Laid-Open No. 8-293478 has disclosed a wafer cleaning method capable of increasing the cleaning efficiency by supplying ultrasonic waves while rotating a wafer, and an apparatus for practicing this method.

The wafer cleaning method disclosed in Japanese Patent Laid-Open No. 8-293478 is based on the recognition that a wafer is most efficiently cleaned at the interface between a cleaning solution and ambient atmosphere. In the wafer cleaning method, therefore, particles inevitably attach to a wafer at the interface between the cleaning solution and ambient atmosphere.

In the wafer cleaning apparatus disclosed in Japanese Patent Laid-Open No. 8-293478, a cam mechanism for rotating a wafer is arranged immediately below the wafer, so a rotating force is not efficiently transmitted to the wafer. In the wafer cleaning apparatus, the transmission of ultrasonic waves is interrupted because the cam mechanism is laid out to completely shield the wafer from below. As a result, the strength of ultrasonic waves differs between the center and peripheral portion of the wafer, and the wafer cannot be uniformly processed. This nonuniformity cannot be improved by rotation of the wafer.

SUMMARY OF THE INVENTION

It is an object of the present invention to prevent contamination of a wafer by particles in various wafer processes including cleaning and etching.

It is another object of the present invention to make wafer processing uniform.

A wafer processing apparatus according to the present invention is a wafer processing apparatus for processing a wafer by dipping the wafer into a processing solution, characterized by comprising a processing bath having a depth that allows to completely dip the wafer into the processing solution, wafer rotating means for rotating one or a plurality of wafers held by a wafer holder by using a wafer rotating member which rotates about a shaft shifted from a portion immediately below a barycenter of the one or plurality of wafers, and ultrasonic generating means for generating ultrasonic waves in the processing bath.

In the wafer processing apparatus, only the wafer rotating member is preferably arranged as a member for transmitting a rotating force to the wafer below the one or plurality of wafers held by the wafer holder.

In the wafer processing apparatus, the wafer rotating member preferably comprises at least one rod member substantially parallel to the shaft, and the rod member preferably rotates about the shaft.

In the wafer processing apparatus, the rod member preferably has a diameter much smaller than a diameter of a cylinder virtually formed upon rotation of the rod member about the shaft.

In the wafer processing apparatus, the rod member preferably has a groove which engages with a peripheral portion of the wafer.

In the wafer processing apparatus, a section of the rod member taken along the shaft preferably has a substantially sine-wave shape.

In the wafer processing apparatus, a section of the rod member taken along the shaft preferably has a substantially full-wave rectifying shape.

In the wafer processing apparatus, the wafer rotating means preferably further comprises driving force generating means arranged outside the processing bath, and driving force transmission means for transmitting a driving force generated by the driving force generating means to the wafer rotating member and rotating the wafer rotating member.

The wafer processing apparatus preferably further comprises a dividing member for dividing an interior of the processing bath into a processing wafer side and a side of the driving force transmission means.

In the wafer processing apparatus, the driving force transmission means preferably transmits the driving force generated by the driving force generating means through a crank mechanism.

In the wafer processing apparatus, the processing bath preferably comprises a circulating mechanism having an overflow bath.

In the wafer processing apparatus, the circulating mechanism preferably comprises contamination reducing means for reducing contamination of the wafer by particles.

In the wafer processing apparatus, the contamination reducing means preferably comprises a filter.

In the wafer processing apparatus, the contamination reducing means preferably comprises means for adjusting flow of the processing solution in the processing bath.

In the wafer processing apparatus, the ultrasonic generating means preferably comprises an ultrasonic bath and an ultrasonic source, and the processing bath preferably receives ultrasonic waves through an ultrasonic transmitting medium set in the ultrasonic bath.

The wafer processing apparatus preferably further comprises driving means for changing a relative positional relationship between the ultrasonic source and a wafer to be processed.

In the wafer processing apparatus, the driving means preferably moves the ultrasonic source within the ultrasonic bath.

In the wafer processing apparatus, at least portions of constituent members of the processing bath and the wafer rotating means which may come into contact with the processing solution are preferably made of one material selected from the group consisting of quartz and plastic.

In the wafer processing apparatus, at least portions of constituent members of the processing bath and the wafer rotating means which may come into contact with the processing solution are preferably made of one material selected from the group consisting of a fluorine resin, vinyl chloride, polyethylene, polypropylene, polybutyleneterephthalate (PBT), and polyetheretherketone (PEEK).

A wafer processing method according to the present invention is a wafer processing method of processing a wafer while ultrasonic waves are supplied, characterized by comprising processing the wafer while entirely dipping the wafer into a processing solution and rotating the wafer.

A wafer processing method according to the present invention is a wafer processing method of processing a wafer while ultrasonic waves are supplied, characterized by comprising processing the wafer while entirely dipping the wafer into a processing solution, and rotating and vertically moving the wafer.

A wafer processing method according to the present invention is a wafer processing method of processing a wafer while ultrasonic waves are supplied, characterized by comprising processing the wafer while entirely dipping the wafer into a processing solution and changing a position of an ultrasonic source.

The wafer processing method according to the present invention is characterized in that the wafer is cleaned using a wafer cleaning solution as the processing solution.

The wafer processing method is suitable for a method of etching the wafer using a wafer etching solution as the processing solution.

The wafer processing method is suitable for a method of etching a porous silicon layer of a wafer having the porous silicon layer using a porous silicon etching solution as the processing solution.

The wafer processing method is suitable for a method of etching a porous silicon layer of a wafer having the porous silicon layer using, as the processing solution, any one of (a) hydrofluoric acid,
(b) solution mixture prepared by adding at least one of alcohol and hydrogen peroxide to hydrofluoric acid,
(c) buffered hydrofluoric acid,
(d) solution mixture prepared by adding at least one of alcohol and hydrogen peroxide to buffered hydrofluoric acid, and
(e) solution mixture of hydrofluoric acid, nitric acid, and acetic acid.

A semiconductor substrate fabrication method according to the present invention is characterized by comprising the step of forming a non porous layer on a porous layer formed on a surface of a first substrate, the step of bonding a first substrate side of a prospective structure and a second substrate prepared separately to sandwich the non porous layer between the first substrate side and the second substrate, the removal step of removing the first substrate from the bonded structure to expose the porous layer on a second substrate side thereof, and the etching step of etching the porous layer while the second substrate side on which the porous layer is exposed is completely dipped into an etching solution, and ultrasonic waves are supplied, thereby exposing surface of the second substrate side, the etching step rotating the second substrate side.

A semiconductor substrate fabrication method according to the present invention is characterized by comprising the step of forming a non porous layer on a porous layer formed on a surface of a first substrate, the step of bonding a first substrate side of a prospective structure and a second substrate prepared separately to sandwich the non porous layer between the first substrate side and the second substrate, the removal step of removing the first substrate from the bonded structure to expose the porous layer on a second substrate side thereof, and the etching step of etching the porous layer while the second substrate side on which the porous layer is exposed is completely dipped into an etching solution, and ultrasonic waves are supplied, thereby exposing surface of the second substrate side, the etching step rotating and vertically moving the second substrate side.

A semiconductor substrate fabrication method according to the present invention is characterized by comprising the step of forming a non porous layer on a porous layer formed on a surface of a first substrate, the step of bonding a first substrate side of a prospective structure and a second substrate prepared separately to sandwich the non porous layer between the first substrate side and the second substrate, the removal step of removing the first substrate from the bonded structure to expose the porous layer on a second substrate side thereof, and the etching step of etching the porous layer while the second substrate side on which the porous layer is exposed is completely dipped into an etching solution, and ultrasonic waves are supplied, thereby exposing surface of the second substrate side, the etching step changing a position of an ultrasonic bath.

The etching solution used in the etching step is preferably any one of (a) hydrofluoric acid,
(b) solution mixture prepared by adding at least one of alcohol and hydrogen peroxide to hydrofluoric acid,
(c) buffered hydrofluoric acid,
(d) solution mixture prepared by adding at least one of alcohol and hydrogen peroxide to buffered hydrofluoric acid, and
(e) solution mixture of hydrofluoric acid, nitric acid, and acetic acid.

The removal step preferably comprises exposing the porous layer by grinding, polishing, or etching the first substrate from a back surface.

The removal step preferably comprises separating the first substrate side and the second substrate side at a boundary of the porous layer.

The non porous layer is preferably a single-crystal silicon layer.

The non porous layer is preferably made up of a single-crystal silicon layer and a silicon oxide layer formed on the single-crystal silicon layer.

The non porous layer is preferably a compound semiconductor layer.

The second substrate is preferably a silicon substrate.

The second substrate is preferably a silicon substrate having a silicon oxide film formed on a surface to be bonded to the first substrate side.

The second substrate is preferably a light-transmitting substrate.

Further objects, features and advantages of the present invention will become apparent from the following detailed description of embodiments of the present invention with reference to the accompanying drawings.

DETAILED DESCRIPTION OF THE PREFERRED EMBODIMENTS

Preferred embodiments of the present invention will be described in detail below with reference to the accompanying drawings.

First Embodiment

Figure 1:
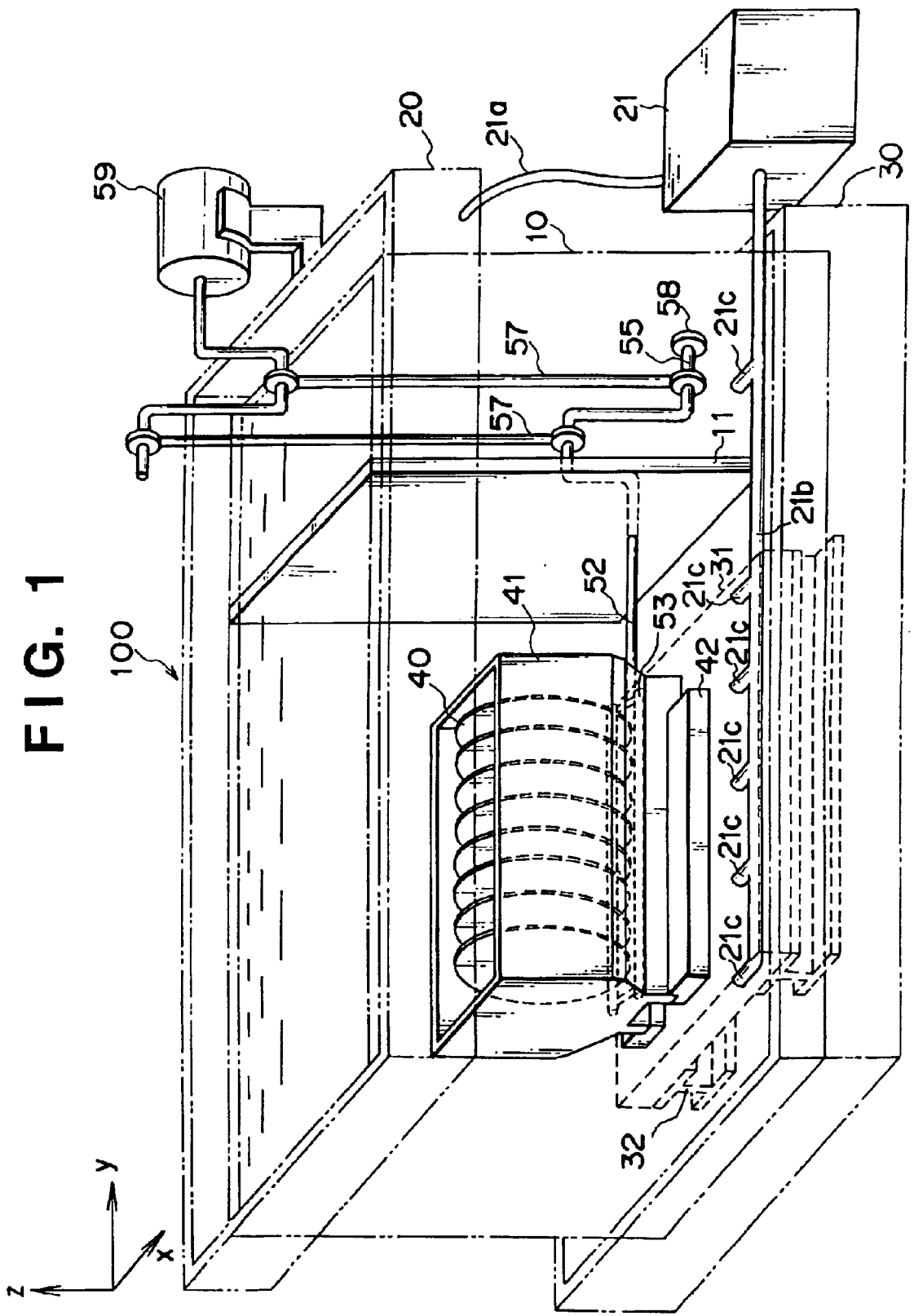
FIG. 1 is a perspective view showing the schematic construction of a wafer processing apparatus according to the first embodiment of the present invention.
Figure 2:
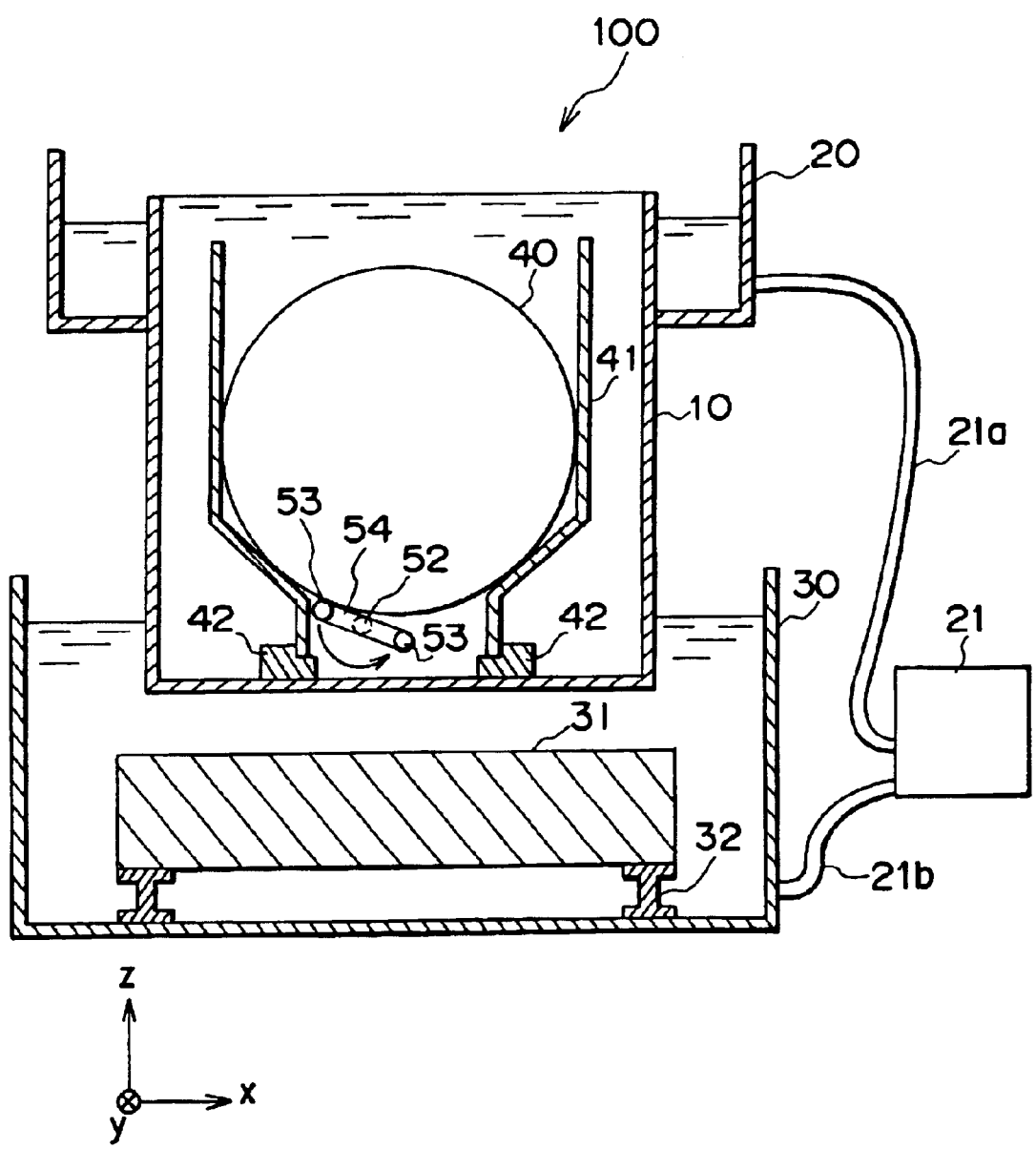
FIG. 2 is a sectional view of the wafer processing apparatus shown in FIG. 1.

FIG. 1 is a perspective view showing the schematic construction of a wafer processing apparatus according to the first embodiment of the present invention. FIG. 2 is a sectional view of the wafer processing apparatus shown in FIG. 1.

In a wafer processing apparatus 100 according to this embodiment, portions which may come into contact with a processing solution are preferably made from quartz or plastic in accordance with the intended use. Preferable examples of the plastic are a fluorine resin, vinyl chloride, polyethylene, polypropylene, polybutyleneterephthalate (PBT), and polyetheretherketone (PEEK). Preferable examples of the fluorine resin are PVDF, PFA, and PTFE.

This wafer processing apparatus 100 has a wafer processing bath 10, an overflow bath 20, an ultrasonic bath 30, and a wafer rotating mechanism (52 to 59) for rotating wafers 40.

To process wafers, the wafer processing bath 10 is filled with a processing solution (e.g., an etching solution or a cleaning solution). The overflow bath 20 for temporarily storing any processing solution overflowing from the wafer processing bath 10 is provided around the upper portion of the wafer processing bath 10. The processing solution temporarily stored in the overflow bath 20 is discharged from the bottom portion of the overflow bath 20 to a circulator 21 through a discharge pipe 21a. The circulator 21 removes particles by filtering the discharged processing solution and supplies the processing solution to the bottom portion of the wafer processing bath 10 through a supply pipe 21b. Consequently, particles in the wafer processing bath 10 are efficiently removed.

The wafer processing bath 10 must have a depth by which the wafers 40 are completely dipped. This prevents particles from attaching to the wafers 40 at the interface between the processing solution and ambient atmosphere, and makes processing for the wafers 40 uniform.

When wafers are processed by completely dipping them into the processing solution, and particles attach to the wafers in the processing solution, the particles easily return into the processing solution. However, if only parts of wafers are dipped into the processing solution, particles attaching to the wafers at the interface between the processing solution and ambient atmosphere are hardly removed from the wafers, and exposed to ambient atmosphere while attaching to the wafers. Particles thus attaching to wafers are scarcely removed from the wafers even by dipping the attached portions of the wafers into the processing solution again. Particularly, when the wafer surface is hydrophobic (e.g., a silicon wafer not having any silicon oxide film), particles completely attach to the wafer surface and become more difficult to remove because the wafer surface is exposed to a dry atmosphere.

The ultrasonic bath 30 is arranged below the wafer processing bath 10. An ultrasonic source 31 is supported by an adjusting mechanism 32 inside the ultrasonic bath 30. This adjusting mechanism 32 includes a mechanism for adjusting the vertical position of the ultrasonic source 31 and a mechanism for adjusting the horizontal position of the ultrasonic source 31, as mechanisms for adjusting the relative positional relationship between the ultrasonic source 31 and the wafer processing bath 10 (wafers 40). By this mechanism, ultrasonic waves to be supplied to the wafer processing bath 10, more specifically, to the wafers 40 can be optimized. The ultrasonic source 31 preferably has a function of adjusting the frequency or strength of ultrasonic waves to be generated. This further optimizes the supply of ultrasonic waves.

Since the apparatus thus has the mechanism for optimizing the supply of ultrasonic waves to the wafers 40, various types of wafers can be processed. Swinging the ultrasonic source 31 by the adjusting mechanism 32 while the wafers 40 are processed can make processing for the wafers 40 uniform. Changing the frequency of ultrasonic waves while the wafers 40 are processed can also make processing for the wafers 40 uniform.

The ultrasonic bath 30 is filled with an ultrasonic transmitting medium (e.g., water), and this ultrasonic transmitting medium transmits ultrasonic waves to the wafer processing bath 10.

The wafers 40 are held to be nearly perpendicular to the bottom surface of the wafer processing bath 10 by a wafer holder 41. The wafer holder 41 is detachable from the wafer processing bath 10. The wafer holder 41 is suitably a carrier cassette generally used. The wafer holder 41 is set at a predetermined position by positioning members 42 fixed to the bottom surface of the wafer processing bath 10.

Figure 3:
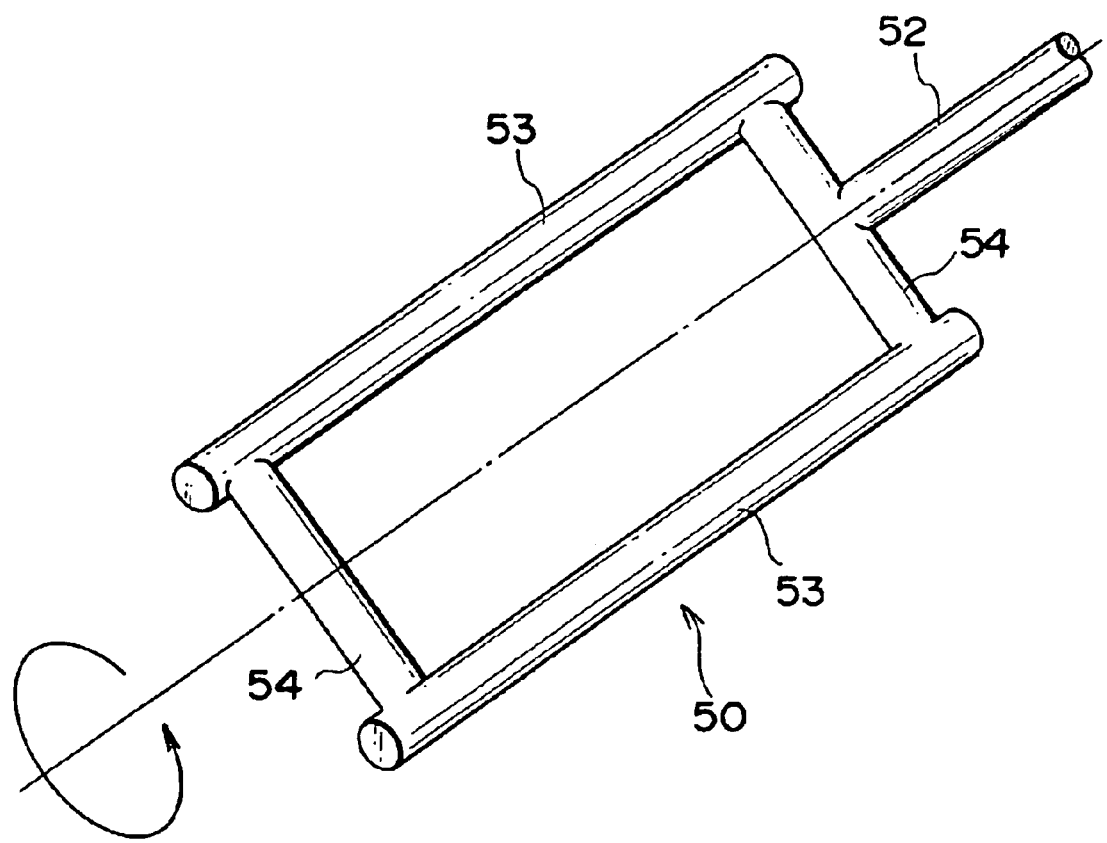
FIG. 3 is a perspective view showing an example of the construction of a wafer rotating member.

A wafer rotating member 50 for rotating the wafers 40 while vertically moving them is arranged below the wafers 40. FIG. 3 is a perspective view showing an example of the construction of the wafer rotating member 50.

In the wafer rotating member 50, two wafer rotating rods 53 arranged substantially parallel to each other are coupled through connecting rods 54, and a rotating shaft 52 is coupled to almost the center of one connecting rod 54. The wafer rotating member 50 is pivotally supported at the rotating shaft 52 by a shaft support portion 11. Note that another rotating shaft may be arranged on the side opposite to the rotating shaft 52.

The diameter of the wafer rotating rod 53 is set much smaller than the diameter of a cylinder virtually formed upon rotation of the wafer rotating rods 53. With this setting, the transmission efficiency of a rotating torque and ultrasonic waves to the wafers 40 can be increased.

Standing waves, i.e., high- and low-strength portions of ultrasonic waves are usually formed between the bottom surface of the wafer processing bath 10 and the liquid surface. In this wafer processing apparatus 100, however, processing for the wafers 40 can be made uniform because the wafers 40 are rotated while being vertically moved by rotation of the wafer rotating member 50.

Since the wafer rotating member 50 has the minimum member which interrupts the transmission of ultrasonic waves between the bottom surface of the wafer processing bath 10 and the wafers 40, the transmission efficiency of ultrasonic waves to the wafers 40 can be greatly increased. The wafer rotating member 50 also has a function of agitating the processing solution. This agitation also makes processing for the wafers 40 uniform.

The wafer rotating rod 53 preferably has a shape that allows an increase in frictional force when it comes into contact with the wafers 40, in order to prevent the wafers 40 and the wafer rotating rod 53 from slipping upon applying ultrasonic waves.

Figure 6A:
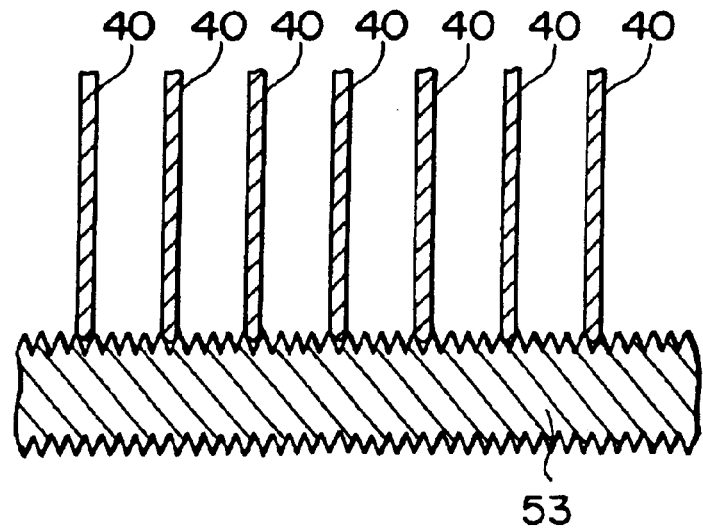
FIGS. 6A and 6B are sectional views, respectively, showing another example of the construction of a wafer rotating rod.
Figure 6B:
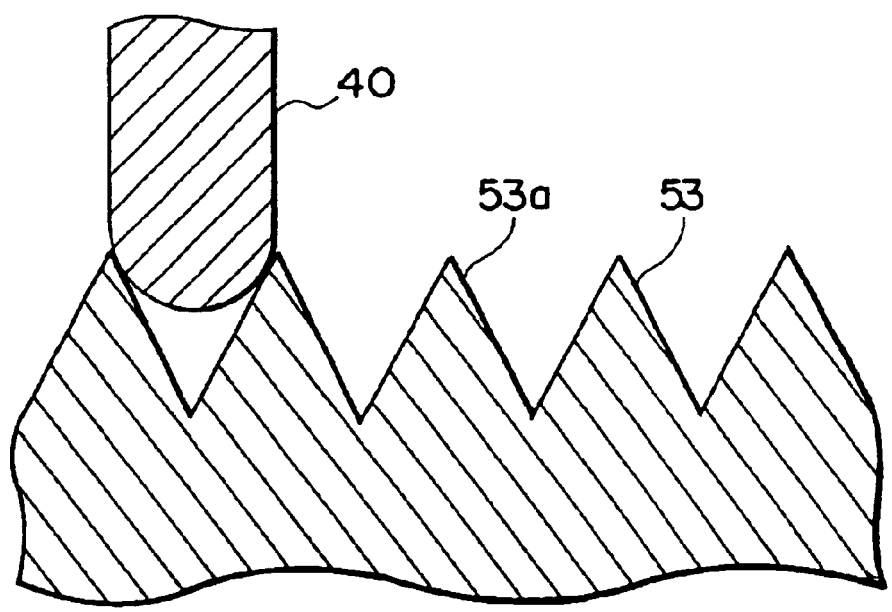

FIGS. 6A and 6B are sectional views, respectively, showing another example of the construction of the wafer rotating rod 53. The wafer rotating rod 53 has many V-shaped grooves 53a in a saw form which engage with the wafers 40. By forming the surface of the wafer rotating rod 53 into such a shape as to pinch the wafers 40, a slip between the wafers 40 and the wafer rotating rod 53 can be suppressed upon applying ultrasonic waves.

Figure 7A:
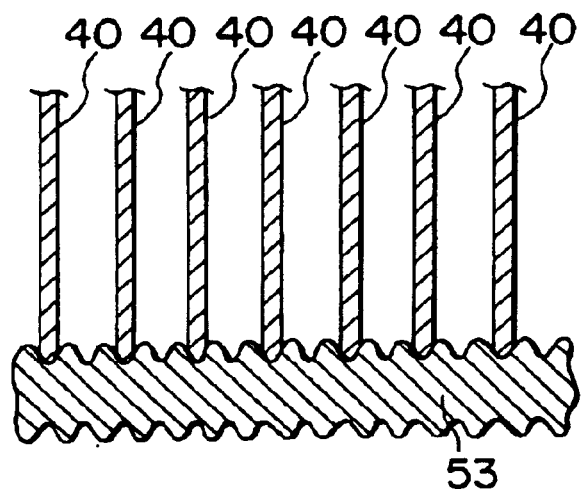
FIGS. 7A and 7B are sectional views, respectively, showing still another example of the construction of the wafer rotating rod.
Figure 7B:
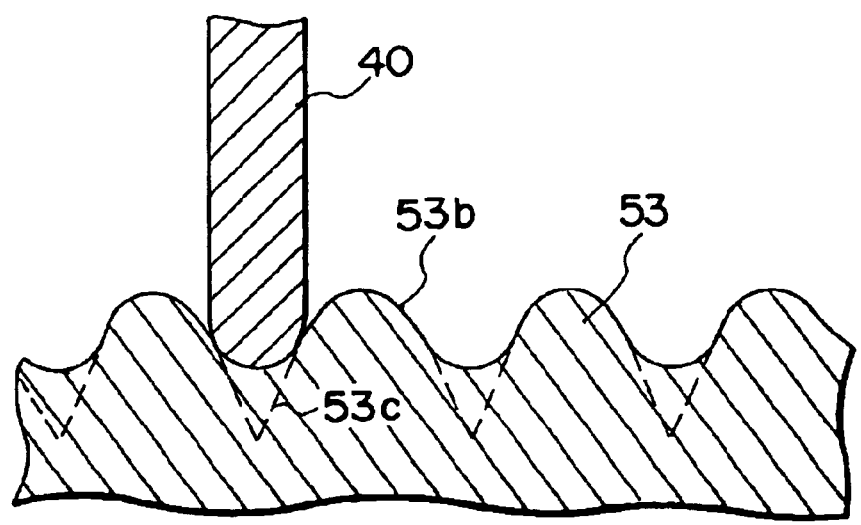

FIGS. 7A and 7B are sectional views, respectively, showing still another example of the construction of the wafer rotating rod 53. The section of this wafer rotating rod 53 has a sine-wave shape. The wafer rotating rod 53 can come into substantially surface contact with the peripheral portions of the wafers 40, and can pinch the wafers 40. Therefore, a slip between the wafers 40 and the wafer rotating rod 53 is more effectively suppressed upon applying ultrasonic waves. Further, since this wafer rotating rod 53 does not have any acute-angled portion, unlike the wafer rotating rod 53 shown in FIGS. 6A and 6B, particles produced upon contact with the wafers 40 can be reduced. This effect can also be achieved by forming grooves 53c with a full-wave rectifying shape.

Figure 8A:
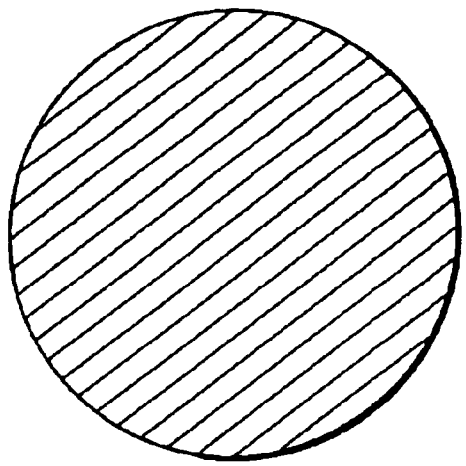
FIGS. 8A to 8C are views each showing an example of the shape of the section of the wafer rotating rod.
Figure 8B:
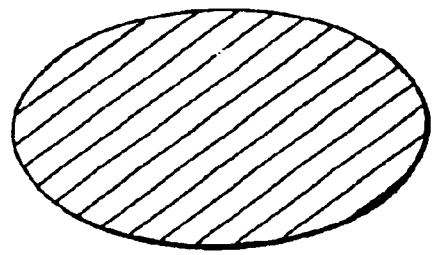
Figure 8C:
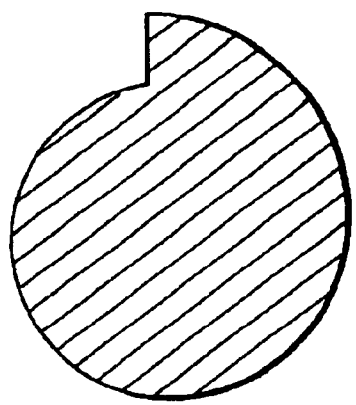

FIGS. 8A, 8B, and 8C are views each showing an example of the shape of the section of the wafer rotating rod 53. The section of the wafer rotating rod 53 can have various shapes. For example, its section may have a circular shape as shown in FIG. 8A, an elliptic shape as shown in FIG. 8B, or a shape as shown in FIG. 8C.

The rotating shaft 52 of the wafer rotating member 50 is preferably shifted from a position immediately below the barycenter of the wafers 40 toward the side wall of the wafer holder 41 (x-axis direction).

Although the rotational direction of the wafer rotating rods 53 is not particularly limited, it is preferably a direction to lift the wafers 40 by the wafer rotating rod 53 closer to a position immediately below the barycenter of the wafers 40 (to be referred to as the lifting direction hereinafter), as shown in FIG. 2. This is because, if the wafer rotating rods 53 are rotated in the lifting direction, a force acts on the wafers 40 substantially vertically, and hence friction between the wafers 40 and the side wall of the wafer holder 41 becomes small.

Figure 4A:
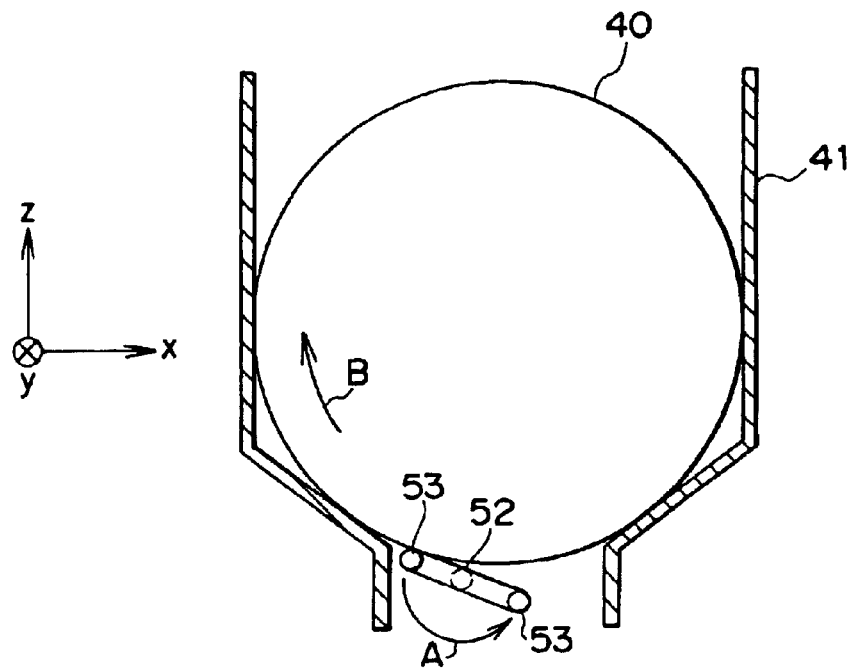
FIGS. 4A and 4B are views, respectively, showing the movement of a wafer when the wafer rotating member is rotated in a lifting direction.
Figure 4B:
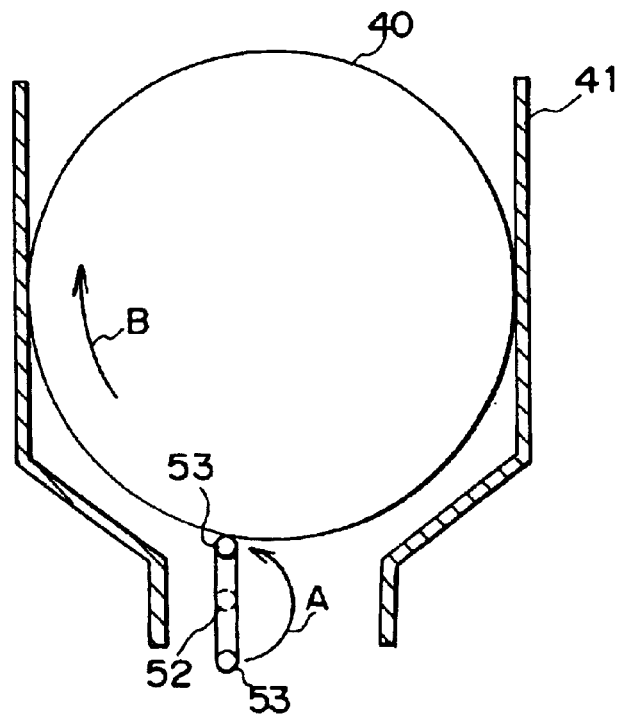

FIGS. 4A and 4B are views, respectively, showing the movement of the wafer 40 upon rotating the wafer rotating member 50 in the lifting direction. A direction A shows the lifting direction, and a direction B shows the rotational direction of the wafer 40. The wafer 40 rotates in the direction B from the state in FIG. 4A while being substantially vertically lifted by the wafer rotating rod 53 on a side immediately below the barycenter of the wafer 40. The wafer 40 passes through the state shown in FIG. 4B, and returns to the state shown in FIG. 4A after the wafer rotating rods 53 rotate through 180°. Accordingly, the wafer 40 rotates while swinging vertically.

Figure 5A:
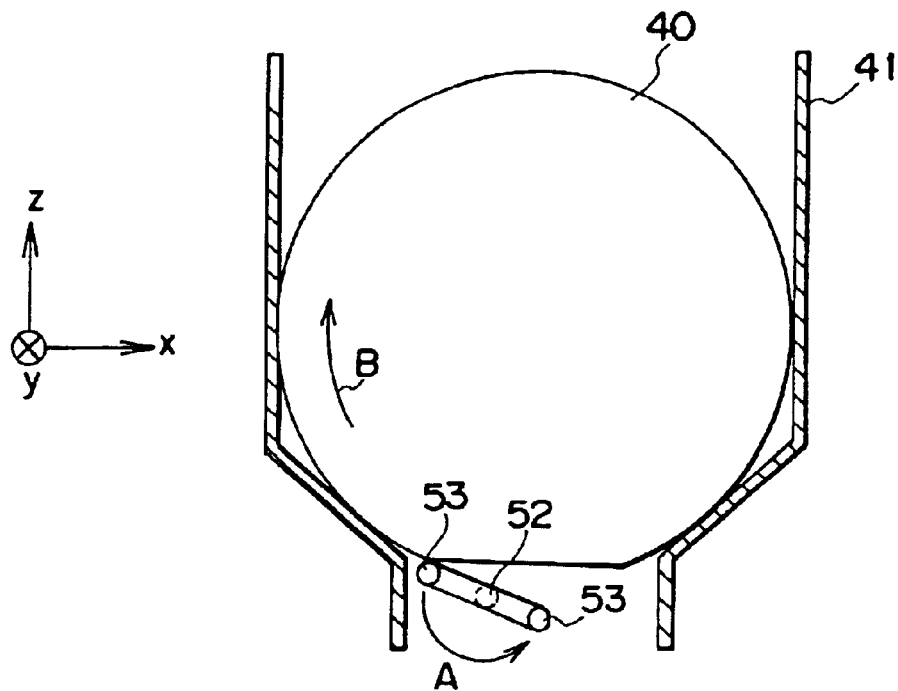
FIGS. 5A and 5B are views, respectively, showing the movement of a wafer having an orientation flat.
Figure 5B:
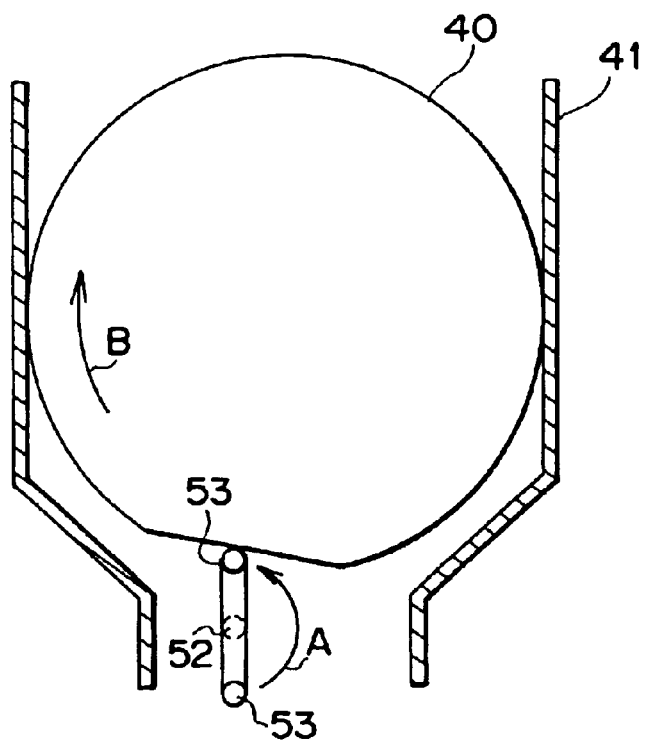

Since the wafer rotating member 50 rotates so as to virtually form a cylinder by the two wafer rotating rods 53, it can properly transmit a rotating force to even a wafer having an orientation flat. FIGS. 5A and 5B are views, respectively, showing the movement of a wafer 40 having an orientation flat.

Not to interrupt the transmission of ultrasonic waves while the wafer 40 is efficiently rotated and vertically moved, the number of wafer rotating rods 53 is preferably two, as described above. However, the number of wafer rotating rods 53 may be one. Also in this case, the wafer 40 can be rotated and vertically moved. As far as the interruption of the transmission of ultrasonic waves can be allowed, the number of wafer rotating rods 53 may be three or more (for example, they are cylindrically laid out).

Figure 9:
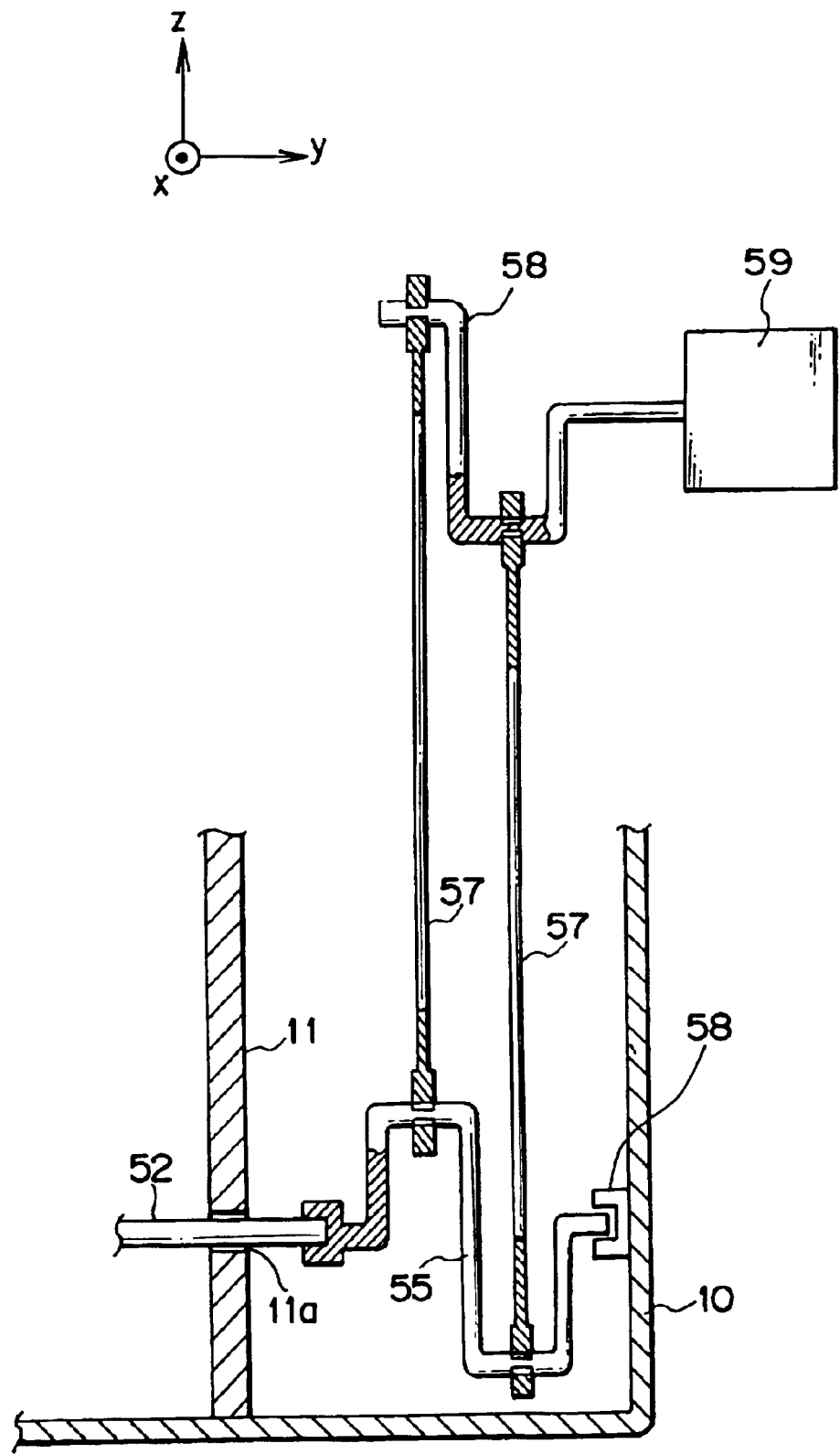
FIG. 9 is a view showing a mechanism for transmitting a driving torque generated by a motor to the rotating shaft of the wafer rotating member.

FIG. 9 is a view showing a mechanism for transmitting a driving torque generated by a motor 59 to the rotating shaft 52 of the wafer rotating member 50. The driving torque generated by the motor 59 is transmitted to a crank 55 via a crank 58 and connecting rods 57. One end of the crank 55 is coupled to the rotating shaft 52 so as to fit thereon, whereas the other end is pivotally supported by a bearing 58. The rotating shaft 52 is pivotally supported by a bearing portion 11a formed in the shaft support portion 11, and rotates upon reception of the driving torque transmitted through the crank 55.

The wafer rotating mechanism is not limited to the above construction, and suffices only to rotate the rotating shaft 52. For example, a bevel gear, a belt, or the like can replace the crank mechanism in order to transmit a driving torque generated by the motor 59 to the rotating shaft 52.

In this embodiment, the shaft support portion 11 defines the wafer 40 side and the crank 55 side in order to prevent particles produced by friction between the crank 55 and the connecting rod 57 and friction between the crank 55 and the bearing 58 from flowing to the wafer 40 side.

To more completely prevent particles from flowing to the wafer 40 side, the shaft support portion 11 is preferably extended to (or higher than) the upper end of the wafer processing bath 10 to divide the interior of the wafer processing bath 10 into two parts.

However, particles produced on the crank 55 side may flow to the wafer 40 side through the bearing portion 11a, or particles may be produced at the bearing portion 11a.

For this reason, the wafer processing apparatus 100 circulates the processing solution upward from the bottom portion of the wafer processing bath 10 by arranging supply ports 21c for supplying the processing solution to the wafer processing bath 10, near the bottom portion of the wafer processing bath 10. Further, by arranging many supply ports 21c on the wafer 40 side, the wafer processing apparatus 100 adjusts the flowing direction of the processing solution so as to prevent the processing solution on the crank 55 side from flowing to the wafer 40 side. Accordingly, contamination of the wafers 40 by particles produced on the crank 55 side can be reduced.

The wafer processing apparatus 100 can also employ another means for preventing contamination of the wafers 40 by particles. For example, it is suitable to adjust the diameter of each supply port 21c.

Second Embodiment

The second embodiment will exemplify a wafer processing method adopting the wafer processing apparatus according to the first embodiment, and a semiconductor substrate fabrication method including this wafer processing method as part of the process.

FIGS. 10A to 10F are views, respectively, showing the method of fabricating a semiconductor wafer. Roughly speaking, in this fabrication method, the first substrate is prepared by forming a porous silicon layer on a single-crystal silicon substrate, forming a non porous layer on the porous silicon layer, and preferably forming an insulating film on the non porous layer. The first structure and a second substrate prepared separately are so bonded as to sandwich the insulating film between them. After that, the single-crystal silicon substrate is removed from the back surface of the first substrate, and the porous silicon layer is etched to fabricate a semiconductor substrate.

The method of fabricating a semiconductor substrate will be described in detail below with reference to FIGS. 10A to 10F.

Figure 10A:
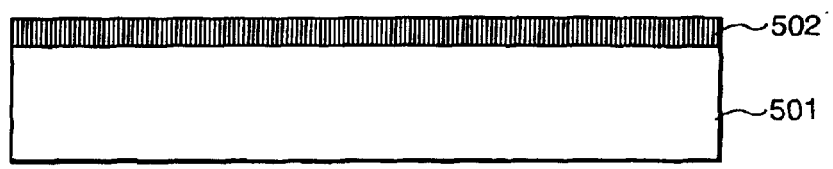
FIGS. 10A to 10F are views, respectively, showing the method of fabricating a semiconductor wafer.
Figure 10B:
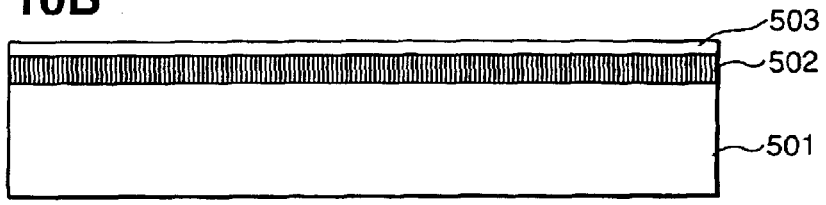

A single-crystal Si substrate 501 for forming the first substrate is prepared, and a porous Si layer 502 is formed on the major surface of the single-crystal Si substrate 501 (FIG. 10A). At least one non porous layer 503 is formed on the porous Si layer 502 (FIG. 10B). Preferable examples of the non porous layer 503 are a single-crystal Si layer, a poly-Si layer, an amorphous Si layer, a metal film layer, a compound semiconductor layer, and a superconductor layer. An element such as MOSFET may be formed on the non porous layer 503.

Figure 10C:
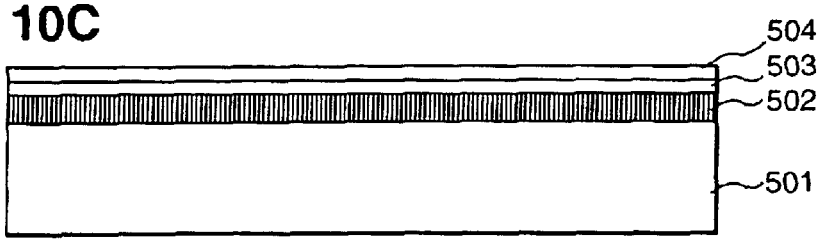

An $SiO_2$ layer 504 is preferably formed as another non porous layer on the non porous layer 503, and used as the first substrate (FIG. 10C). The $SiO_2$ layer 504 is useful because, when the first substrate and a second substrate 505 are bonded in the subsequent step, the interface energy at the bonded interface can be removed from an active layer.

Figure 10D:
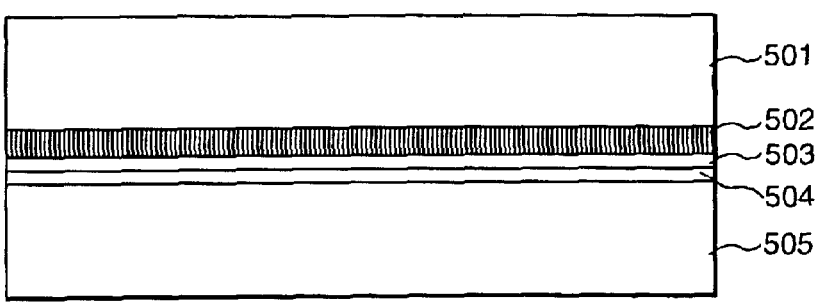

The first substrate and the second substrate 505 are tightly bonded at room temperature so as to sandwich the $SiO_2$ layer 504 between them (FIG. 10D). This bonding may be strengthened by performing anodic bonding, pressurization, or heat treatment, as needed, or a combination of them.

When a single-crystal Si layer is formed as the non porous layer 503, the first substrate is preferably bonded to the second substrate 505 after the $SiO_2$ layer 504 is formed on the surface of the single-crystal Si layer by thermal oxidization or the like.

Preferable examples of the second substrate 505 are an Si substrate, a substrate having an $SiO_2$ layer formed on an Si substrate, a light-transmitting substrate such as a quartz substrate or the like, and a sapphire substrate. The second substrate 505 suffices to have a flat surface to be bonded, and may be another type of substrate.

FIG. 10D shows the bonded state of the first and second substrates via the $SiO_2$ layer 504. The $SiO_2$ layer 504 need not be formed when the non porous layer 503 or the second substrate is not Si.

In bonding, a thin insulating plate may be inserted between the first and second substrates.

Figure 10E:
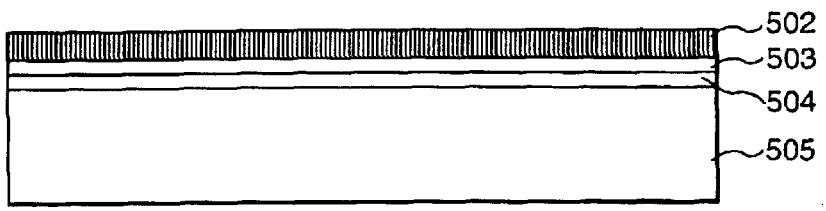

The first substrate is removed from the second substrate at the boundary of the porous Si layer 502 (FIG. 10E). The removal method includes the first method (of discarding the first substrate) using grinding, polishing, etching, or the like, and the second method of separating the first and second substrates at the boundary of the porous layer 502. In the second method, the first substrate can be recycled by removing porous Si left on the separated first substrate, and planarizing the surface of the first substrate, as needed.

Figure 10F:
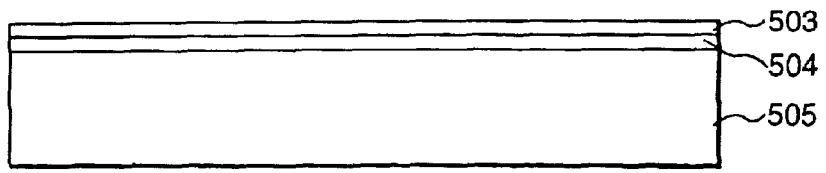

The porous Si layer 502 is selectively etched and removed (FIG. 10F). The wafer processing apparatus 100 is suitable for this etching. Since this wafer processing apparatus supplies ultrasonic waves while completely dipping a wafer (in this case, the wafer shown in FIG. 1E) into an etching solution and moving (e.g., rotating or vertically moving) it, the wafer is hardly contaminated by particles, and the etching is made uniform. According to this wafer processing apparatus, the etching time is shortened, and the etching selectivity between the non porous layer 503 and the porous layer 504 increases. The etching time is shortened because etching is promoted by ultrasonic waves, and the etching selectivity increases because the promotion of etching by ultrasonic waves is more remarkable on the porous layer 504 than on the non porous layer 503.

When the non porous layer 503 is single-crystal Si, the following etching solutions are suited in addition to a general etching solution for Si.

(a) hydrofluoric acid (b) solution mixture prepared by adding at least one of alcohol and hydrogen peroxide to hydrofluoric acid (c) buffered hydrofluoric acid (d) solution mixture prepared by adding at least one of alcohol and hydrogen peroxide to buffered hydrofluoric acid (e) solution mixture of hydrofluoric acid, nitric acid, and acetic acid Using these etching solutions, the porous layer 502 can be selectively etched to leave the underlying non porous layer 503 (single-crystal Si). The porous layer 502 is readily selectively etched by these etching solutions because porous Si has an enormous surface area and hence etching of the porous Si progresses at a very high speed in comparison with the non porous Si layer.

FIG. 10E schematically shows a semiconductor substrate obtained by the above fabrication method. According to this fabrication method, the flat non porous layer 503 (e.g., single-crystal Si layer) is uniformly formed on the entire surface of the second substrate 505.

For example, if an insulating substrate is employed as the second substrate 505, the semiconductor substrate obtained by the above fabrication method is effectively used to form insulated electronic elements.

Examples of the wafer processing performed by the wafer processing apparatus 100 and the semiconductor wafer fabrication method including the wafer processing as part of the process will be described below.

EXAMPLE 1

This example is directed to cleaning processing.

Wafers were set in the wafer processing bath 10 filled with ultrapure water, and ultrasonic waves of about 1 MHz were applied to clean the wafers while the wafers were rotated. By this cleaning, 90% or more of particles on the wafer surfaces were removed. Also, this removal of particles was done uniformly on the wafer surface.

EXAMPLE 2

This example concerns cleaning processing using a solution mixture of ammonia, hydrogen peroxide, and ultrapure water. Cleaning using this solution mixture is suited to particle removal from the surface of a silicon wafer.

Silicon wafers were set in the wafer processing bath 10 filled with a solution mixture of ammonia, hydrogen peroxide, and ultrapure water at about 80° C. While the wafers were rotated, ultrasonic waves of about 1 MHz were applied to clean the wafers. By this cleaning, 95% or more of particles were removed from the wafer surfaces. Also, this removal of particles was done uniformly on the wafer surface.

EXAMPLE 3

This example pertains to etching of a silicon layer.

Silicon wafers were set in the wafer processing bath 10 filled with a solution mixture prepared by mixing hydrofluoric acid, nitric acid, and acetic acid at a ratio of 1:200:200. While the wafers were rotated, ultrasonic waves of about 0.5 MHz were applied to etch the wafer surfaces for 30 sec. Consequently, the silicon wafers were uniformly etched by about 1.0 $\mu$m. The uniformity of the etching rate was ±5% or less on the wafer surface and between the wafers.

EXAMPLE 4

This example relates to etching of an $SiO_2$ layer. Hydrofluoric acid is suitable for the etching of an $SiO_2$ layer.

Wafers on which an $SiO_2$ layer was formed were set in the wafer processing bath 10 filled with 1.2% hydrofluoric acid. While the wafers were rotated, ultrasonic waves of about 0.5 MHz were applied to etch the $SiO_2$ layer for 30 sec. Consequently, the $SiO_2$ layer was uniformly etched by about 4 nm. The uniformity of the etching rate was ±3% or less on the wafer surface and between the wafers.

EXAMPLE 5

This example is about to etching of an $Si_3N_4$ layer. Hot concentrated phosphoric acid is suitable for the etching of an $Si_3N_4$ layer.

Wafers on which an $Si_3N_4$ layer was formed were set in the wafer processing bath 10 filled with hot concentrated phosphoric acid. While the wafers were rotated, ultrasonic waves of about 0.5 MHz were applied to etch the $Si_3N_4$ layer. Consequently, the $Si_3N_4$ layer was uniformly etched by about 100 nm. The uniformity of the etching rate was ±3% or less on the wafer surface and between the wafers.

EXAMPLE 6

This example exemplifies to etching of a porous silicon layer. A solution mixture of hydrofluoric acid, hydrogen peroxide, and ultrapure water is suitable for the etching of a porous silicon layer.

Wafers having a porous silicon layer were set in the wafer processing bath 10 filled with a solution mixture of hydrofluoric acid, hydrogen peroxide, and ultrapure water. While the wafers were rotated, ultrasonic waves of about 0.25 MHz were applied to etch the porous silicon layer. Consequently, the porous silicon layer was uniformly etched by 5 $\mu$m. The uniformity of the etching rate was ±3% or less on the wafer surface and between the wafers.

Note that the mechanism of etching of porous silicon is disclosed in K. Sakaguchi et al., Jpn. J. Appl. Phys. Vol. 34, part 1, No. 2B, 842–847 (1995). According to this reference, porous silicon is etched when an etching solution penetrates into the pores of porous silicon by a capillary action and etches the walls of the pores. As the walls of the pores become thinner, these walls cannot support themselves beyond some point. Finally, the porous layer entirely collapses to complete the etching.

EXAMPLE 7

This example concerns an SOI wafer fabrication method. FIGS. 10A to 10F are sectional views showing the steps of the SOI wafer fabrication method according to this example.

First, a single-crystal Si substrate 501 for forming a first substrate was anodized in an HF solution to form a porous Si layer 502 (FIG. 10A). The anodization conditions were as follows.

| | |
|---|---|
| Current density: | 7 (mA/cm$^2$) |
| Anodizing solution: | HF:H$_2$O:C$_2$H$_5$OH = 1:1:1 |
| Time: | 11 (min) |
| Porous Si thickness: | 12 ($\mu$m) |

Subsequently, the resultant substrate was allowed to oxidize in an oxygen atmosphere at 400° C. for 1 h. By this oxidation, the inner walls of pores of the porous Si layer 502 were covered with a thermal oxide film.

A 0.30-$\mu$m thick single-crystal Si layer 503 was epitaxially grown on the porous Si layer 502 by a CVD (Chemical Vapor Deposition) process (FIG. 10B). The epitaxial growth conditions were as follows.

| | |
|---|---|
| Source gas: | SiH$_2$Cl$_2$/H$_2$ |
| Gas flow rates: | 0.5/180 (l/min) |
| Gas pressure: | 80 (Torr) |
| Temperature: | 950 (° C.) |
| Growth rate: | 0.3 ($\mu$m/min) |

Next, a 200-$\mu$m thick $SiO_2$ layer 504 was formed on the single-crystal Si layer (epitaxial layer) 503 by thermal oxidation (FIG. 10C).

The first substrate thus formed as shown in FIG. 10C and an Si substrate 505 as a second substrate were so bonded as to sandwich the $SiO_2$ layer 504 (FIG. 10D).

The single-crystal Si substrate 501 was removed from the first substrate to expose the porous Si layer 502 (FIG. 10E).

The wafers shown in FIG. 10E were set in the wafer processing bath 10 filled with a solution mixture of hydrofluoric acid, hydrogen peroxide, and ultrapure water. While the wafers were rotated, ultrasonic waves of about 0.25 MHz were applied to etch the porous Si layer 502 (FIG. 10F). The uniformity of the etching rate of the porous Si layer 502 was ±5% or less on the wafer surface and between the wafers. By applying ultrasonic waves while wafers are rotated as described above, it is possible to uniformly promote the collapse (etching) of porous Si on the wafer surface and between the wafers.

In the etching of the porous Si layer 502, the single-crystal Si layer (epitaxial layer) 503 functions as an etching stop layer. Therefore, the porous Si layer 502 is selectively etched on the entire surface of the wafer.

That is, the rate at which the single-crystal Si layer 503 is etched by the etching solution described above is very low, so the etching selectivity of the porous Si layer 502 to the single-crystal Si layer 503 is $10^5$ or more. Accordingly, the etching amount of the single-crystal Si layer 503 is about a few tens of Å and practically negligible.

FIG. 10F shows the SOI wafer obtained by the above steps. This SOI wafer has the 0.2-$\mu$m thick single-crystal Si layer 503 on the $SiO_2$ layer 504. The film thickness of this single-crystal Si layer 503 was measured at one hundred points over the entire surface and found to be 201 $\mu$m±4 $\mu$m.

In this example, a heat treatment was further performed in a hydrogen atmosphere at 1100° C. for about 1 h. When the surface roughness of the resultant SOI wafers was evaluated with an atomic force microscope (AFM),. the root-meansquare of the surface roughness in a square region of 5 μm side was about 0.2 μm. This quality is equivalent to that of common Si wafers on the market.

Also, after the above heat treatment the cross-sections of the SOI wafers were observed with a transmission electron microscope. As a consequence, no new crystal defects were produced in the single-crystal Si layer 503, indicating that high crystallinity was maintained.

It is possible to form an $SiO_2$ film on the single-crystal Si film (epitaxial layer) 503 of the first substance as described above, on the surface of the second substrate 505, or on both. In any of these cases, results similar to these described above were obtained.

Furthermore, even when a light-transmitting wafer such as a quartz wafer was used as the second substrate, a high-quality SOI wafer could be formed by the above fabrication steps. However, the heat treatment in the hydrogen atmosphere was performed at a temperature of 1,000° C. or less in order to prevent slip in the single-crystal Si layer 503 caused by the difference between the thermal expansion coefficients of the quartz (second substrate) and the single-crystal Si layer 503.

EXAMPLE 8

This example is directed to another SOI wafer fabrication method. Fabrication steps which can be expressed by drawings are the same as those shown in FIGS. 10A to 10F, so the method will be described below with reference to FIGS. 10A to 10F.

First, a single-crystal Si substrate 501 for forming a first substrate was anodized in an HF solution to form a porous Si layer 502 (FIG. 10A). The anodization conditions were as follows.

| First stage: | |
| --- | --- |
| Current density: | 7 (mA/cm$^2$) |
| Anodizing solution: | HF:H$_2$O:C$_2$H$_5$OH = 1:1:1 |
| Time: | 5 (min) |
| Porous Si thickness: | 5.5 (μm) |
| Second stage: | |
| Current density: | 21 (mA/cm$^2$) |
| Anodizing solution: | HF:H$_2$O:C$_2$H$_5$OH = 1:1:1 |
| Time: | 20 (sec) |
| Porous Si thickness: | 0.5 (μm) |

Subsequently, the resultant substrate was allowed to oxidize in an oxygen atmosphere at 400° C. for 1 h. By this oxidation, the inner walls of pores of the porous Si layer 502 were covered with a thermal oxide film.

A 0.15-μm thick single-crystal Si layer 503 was epitaxially grown on the porous Si layer 502 by a CVD (Chemical Vapor Deposition) process (FIG. 10B). The epitaxial growth conditions were as follows.

| Source gas: | SiH$_2$Cl$_2$/H$_2$ |
| --- | --- |
| Gas flow rates: | 0.5/180 (l/min) |
| Gas pressure: | 80 (Torr) |
| Temperature: | 950 (° C.) |
| Growth rate: | 0.3 (μm/min) |

Next, a 100-nm thick $SiO_2$ layer 504 was formed on the single-crystal Si layer (epitaxial layer) 503 by oxidation (FIG. 10C).

The first substrate thus formed as shown in FIG. 10C and a second Si substrate 505 were so bonded as to sandwich the $SiO_2$ layer 504 (FIG. 10D).

The bonded wafers was separated into two wafers from the porous Si layer formed at a current density of 21 mA/cm$^2$ (second stage), thereby exposing the porous Si layer 503 to the surface of the second substrate 505 (FIG. 10E). Examples of the method of separating the bonded wafers are 1) mechanically pulling the two substrates, 2) twisting the substrates, 3) pressurizing the substrates, 4) driving a wedge between the substrates, 5) peeling the substrates by oxidizing from their end faces, 6) using thermal stress, and 7) applying ultrasonic waves, and it is possible to selectively use any of these methods.

The wafers shown in FIG. 10E were set in the wafer processing bath 10 filled with a solution mixture of hydrofluoric acid, hydrogen peroxide, and ultrapure water. While the wafers were rotated, ultrasonic waves of about 0.25 MHz were applied to etch the porous Si layer 502 (FIG. 10F). The uniformity of the etching rate of the porous Si layer 502 was ±5% or less on the wafer surface and between the wafers. By applying ultrasonic waves while wafers are rotated as described above, it is possible to uniformly promote the collapse (etching) of porous Si on the wafer surface and between the wafers.

In the etching of the porous Si layer 502, the single-crystal Si layer (epitaxial layer) 503 functions as an etching stop layer. Therefore, the porous Si layer 502 is selectively etched on the entire surface of the wafer.

That is, the rate at which the single-crystal Si layer 503 is etched by the etching solution described above is very low, so the etching selectivity of the porous Si layer 502 to the single-crystal Si layer 503 is $10^5$ or more. Accordingly, the etching amount of the single-crystal Si layer 503 is about a few tens of A and practically negligible.

FIG. 10F shows the SOI wafer obtained by the above steps. This SOI wafer has the 0.1-μm thick single-crystal Si layer 503 on the $SiO_2$ layer 504. The film thickness of this single-crystal Si layer 503 was measured at one hundred points over the entire surface and found to be 101 nm ±3 nm.

In this example, a heat treatment was further performed in a hydrogen atmosphere at 1,100° C. for about 1 h. When the surface roughness of the resultant SOI wafers was evaluated with an atomic force microscope (AFM), the root-mean-square of the surface-roughness in a square region of 5 μm side was about 0.2 nm. This quality is equivalent to that of common Si wafers on the market.

Also, after the above heat treatment the cross-sections of the SOI wafers were observed with a transmission electron microscope. As a consequence, no new crystal defects were produced in the single-crystal Si layer 503, indicating that high crystallinity was maintained.

It is possible to form an $SiO_2$ film on the single-crystal Si film (epitaxial layer) 503 of the first substrate as described above, on the surface of the second substrate 505, or on both. In any of these cases, results similar to these described above were obtained.

Furthermore, even when a light-transmitting wafer such as a quartz wafer was used as the second substrate, a high-quality SOI wafer could be formed by the above fabrication steps. However, the heat treatment in the hydrogen atmosphere was performed at a temperature of 1,000° C. or less in order to prevent slip in the single-crystal Si layer 503 caused by the difference between the thermal expansion coefficients of the quartz (second substrate) and the single-crystal Si layer 503.

In this example, the first substrate (to be referred to as the separated substrate hereinafter) obtained by separating the bonded wafers into two wafers can be reused. That is, the separated substrate can be reused as the first or second substrate by selectively etching the porous Si film remaining on the surface of the substrate by the same etching method as for the porous Si film described above and processing the resultant material (e.g., annealing in a hydrogen processing or a surface treatment such as surface polishing).

In examples 7 and 8 described above, epitaxial growth is used to form a single-crystal Si layer on a porous Si layer. However, it is also possible to use other various methods such as CVD, MBE, sputtering, and liquid phase growth in the formation of a single-crystal Si layer.

Also, a semiconductor layer of a single-crystal compound such as GaAs or InP can be formed on a porous Si layer by epitaxial growth. If this is the case, wafers suited to high-frequency devices such as "GaAs on Si" and "GaAs on Glass (Quartz)" and QEIC can be made.

Furthermore, although a solution mixture of 49% hydrofluoric acid and 30% hydrogen peroxide is suitable for an etching solution for selectively etching a porous Si layer, the following etching solutions are also suited. This is so because porous Si has an enormous surface area and hence can be readily selectively etched.

(a) hydrofluoric acid (b) solution mixture prepared by adding at least one of alcohol and hydrogen peroxide to hydrofluoric acid (c) buffered hydrofluoric acid (d) solution mixture prepared by adding at least one of alcohol and hydrogen peroxide to buffered hydrofluoric acid (e) solution mixture of hydrofluoric acid, nitric acid, and acetic acid Note that the other fabrication steps are not limited to the conditions in the above examples, and so other various conditions can be used.

The present invention can reduce contamination of wafers by particles and make wafer processing uniform.

The present invention is not limited to the above embodiments and various changes and modifications can be made within the spirit and scope of the present invention. Therefore, to apprise the public of the scope of the present invention the following claims are made.

What is claimed is:

1. A semiconductor substrate fabrication method, comprising:

the step of forming a non porous layer on a porous layer formed on a surface of a first substrate;

the step of bonding a first substrate side of a prospective structure and a second substrate prepared separately to sandwich said non porous layer between the first substrate side and said second substrate;

the removal step of removing said first substrate from the bonded structure to expose said porous layer on a second substrate side thereof; and the etching step of etching said porous layer while the second substrate side on which said porous layer is exposed is completely dipped into an etching solution, and ultrasonic waves are supplied, thereby exposing surface of the second substrate side, the etching step rotating the second substrate side.

2. The method according to claim 1, wherein the etching solution used in the etching step is any one of (a) hydrofluoric acid, (b) solution mixture prepared by adding at least one of alcohol and hydrogen peroxide to hydrofluoric acid, (c) buffered hydrofluoric acid, p1 (d) solution mixture prepared by adding at least one of alcohol and hydrogen peroxide to buffered hydrofluoric acid, and (e) solution mixture of hydrofluoric acid, nitric acid, and acetic acid.

3. The method according to claim 1, wherein the removal step comprises exposing said porous layer by grinding, polishing, or etching said first substrate from a back surface.

4. The method according to claim 1, wherein the removal step comprises separating the first substrate side and the second substrate side at a boundary of said porous layer.

5. The method according to claim 1, wherein said non porous layer is a single-crystal silicon layer.

6. The method according to claim 1, wherein said non porous layer is made up of a single-crystal silicon layer and a silicon oxide layer formed on said single-crystal silicon layer.

7. The method according to claim 1, wherein said non porous layer is a compound semiconductor layer.

8. The method according to claim 1, wherein said second substrate is a silicon substrate.

9. The method according to claim 1, wherein said second substrate is a silicon substrate having a silicon oxide film formed on a surface to be bonded to the first substrate side.

10. The method according to claim 1, wherein said second substrate is a light-transmitting substrate.

11. A semiconductor substrate fabrication method, comprising:

the step of forming a non porous layer on a porous layer formed on a surface of a first substrate;

the step of bonding a first substrate side of a prospective structure and a second substrate prepared separately to sandwich said non porous layer between the first substrate side and said second substrate;

the removal step of removing said first substrate from the bonded structure to expose said porous layer on a second substrate side thereof; and the etching step of etching said porous layer while the second substrate side on which said porous layer is exposed is completely dipped into an etching solution, and ultrasonic waves are supplied, thereby exposing surface of the second substrate side, the etching step rotating and vertically moving the second substrate side.

12. A semiconductor substrate fabrication method, comprising:

the step of forming a non porous layer on a porous layer formed on a surface of a first substrate;

the step of bonding a first substrate side of a prospective structure and a second substrate prepared separately to sandwich said non porous layer between the first substrate side and said second substrate;

the removal step of removing said first substrate from the bonded structure to expose said porous layer-on a second substrate said thereof; and the etching step of etching said porous layer while the second substrate side on which said porous layer is exposed is completely dipped into an etching solution, and ultrasonic waves are supplied, thereby exposing surface of the second substrate side, the etching step changing a position of an ultrasonic source.

* * * * *

UNITED STATES PATENT AND TRADEMARK OFFICE
CERTIFICATE OF CORRECTION

PATENT NO. : 6,767,840 B1
DATED : July 27, 2004
INVENTOR(S) : Uehara et al.

It is certified that error appears in the above-identified patent and that said Letters Patent is hereby corrected as shown below:

Title page,
Item [56], References Cited, FOREIGN PATENT DOCUMENTS, delete
"JP 0 319 806   6/1989"
"JP 1-304733   8/1989"

Column 7,
Line 33, "further" begins a new paragraph.

Column 10,
Line 5, delete "FIG. 1E" and insert -- FIG. 10E --

Column 12,
Line 26, delete "(° C.)" and insert -- (° C) --
Line 29, delete "200-$\mu$m" and insert -- 200-nm --
Line 63, delete "201-$\mu$m $\pm$ 4$\mu$m" and insert -- 201 nm $\pm$ 4 nm --

Column 13,
Line 2, delete "0.2 $\mu$m" and insert -- 0.2 nm --
Line 62, delete "(° C.) and insert -- (° C) --

Column 14,
Line 46, delete "surface-roughness" and insert -- surface roughness --

Column 16,
Line 1, delete "acid, p1 (d)" and insert -- acid (d) --
Line 57, delete "layer-on" and insert -- layer on --

Signed and Sealed this

Nineteenth Day of April, 2005

JON W. DUDAS
*Director of the United States Patent and Trademark Office*